United States Patent
Dolabdjian et al.

(10) Patent No.: US 12,061,245 B2
(45) Date of Patent: Aug. 13, 2024

(54) DEVICE FOR MEASURING A MAGNETIC FIELD, ASSOCIATED SYSTEM AND METHOD

(71) Applicants: CENTRE NATIONAL DE LA RECHERCHE SCIENTIFIQUE, Paris (FR); ECOLE NATIONALE SUPERIEURE D INGENIEURS DE CAEN, Caen (FR); UNIVERSITE DE CAEN NORMANDIE, Caen (FR)

(72) Inventors: Christophe Dolabdjian, Anguerny (FR); Basile Dufay, Thue Et Mue (FR); Alexandre Esper, Caen (FR); Elodie Portalier, Plan d'Aups Ste Baume (FR); Sébastien Saez, Caen (FR); Julien Gasnier, Valorbicquet (FR); Sylvain Lebargy, Herouville Saint-Clair (FR)

(73) Assignees: CENTRE NATIONAL DE LA RECHERCHE SCIENTIFIQUE, Paris (FR); ECOLE NATIONALE SUPERIEURE D INGENIEURS DE CAEN, Caen (FR); UNIVERSITE DE CAEN NORMANDIE, Caen (FR)

(*) Notice: Subject to any disclaimer, the term of this patent is extended or adjusted under 35 U.S.C. 154(b) by 211 days.

(21) Appl. No.: 17/791,669

(22) PCT Filed: Jan. 8, 2021

(86) PCT No.: PCT/EP2021/050264
§ 371 (c)(1),
(2) Date: Jul. 8, 2022

(87) PCT Pub. No.: WO2021/140196
PCT Pub. Date: Jul. 15, 2021

(65) Prior Publication Data
US 2023/0341482 A1    Oct. 26, 2023

(30) Foreign Application Priority Data

Jan. 10, 2020 (EP) .................................... 20290004

(51) Int. Cl.
*G01R 33/06* (2006.01)
*G01R 33/00* (2006.01)

(52) U.S. Cl.
CPC ....... *G01R 33/063* (2013.01); *G01R 33/0041* (2013.01)

(58) Field of Classification Search
CPC .............. G01R 33/063; G01R 33/0041; G01R 33/0017
See application file for complete search history.

(56) References Cited

U.S. PATENT DOCUMENTS

| | | | | |
|---|---|---|---|---|
| 2001/0030537 A1* | 10/2001 | Honkura | ................ | G01R 33/02 324/249 |
| 2007/0247141 A1* | 10/2007 | Pastre | .................... | G01R 33/07 324/202 |
| 2016/0109478 A1* | 4/2016 | Saito | ...................... | G01Q 60/50 850/47 |

FOREIGN PATENT DOCUMENTS

| | | |
|---|---|---|
| CN | 109 116 273 | 1/2019 |
| CN | 105 455 806 | 3/2019 |

(Continued)

OTHER PUBLICATIONS

Esper, A, et al, "Offset Reduction in GMI-Based Device by Using Double-Frequency Bias-Current Modulation", Oct. 3, 2018, pp. 1-4, vol. 55, No. 1, IEEE Transactions on Magnetics, IEEE Service Center, New York, NY, US, XP011700967.
International Search Report dated Mar. 30, 2021 in International Application No. PCT/EP2021/050264.
European Search Report dated Jun. 24, 2020 in European Application No. 20 29 0004.

*Primary Examiner* — Alvaro E Fortich
(74) *Attorney, Agent, or Firm* — B. Aaron Schulman, Esq.; Stites & Harbison, PLLC

(57) ABSTRACT

This device for measuring a magnetic field comprises:
a magnetic field sensor, comprising:
a probe, and
a pick-up coil and a feedback coil coiled around the probe, and (Continued)

a control circuit, comprising:
  a generation module comprising a probe signal generation unit, configured to generate an electrical current,
  a preamplification module,
  a buffer module, configured to deliver an output signal of the control circuit defining an output magnetic field value,
  a piloting module configured to pilot the probe signal generation unit to generate the electrical current in the probe.

The control circuit comprises a correction module configured to control a working magnetic field, corresponding to a magnetic field maximizing the magnetic field sensitivity of the probe and minimizing the magnetic field noise of the probe.

10 Claims, 3 Drawing Sheets

(56) References Cited

FOREIGN PATENT DOCUMENTS

| JP | 2010 057020 | 3/2010 |
| JP | 2019 184240 | 10/2019 |

* cited by examiner

DEVICE FOR MEASURING A MAGNETIC FIELD, ASSOCIATED SYSTEM AND METHOD

The invention relates to a device for measuring a magnetic field comprising:
- a magnetic field sensor, comprising:
  - a probe formed from an amorphous wire or a ferromagnetic ribbon, and
  - a pick-up coil and a feedback coil, the pick-up coil and the feedback coil being coiled around the probe, and
- a control circuit, comprising:
  - a generation module comprising a probe signal generation unit, configured to generate an electrical current of probe intensity defining a probe voltage between two ends of the probe,
  - a preamplification module, configured to measure and to preamplify a pick-up coil voltage between two ends of the pick-up coil,
  - a buffer module, configured to deliver an output signal of the control circuit, the output signal defining an output magnetic field value deduced from the pick-up coil voltage,
  - a piloting module connected to the generation module and to the buffer module and configured to receive the output signal from the buffer module and to deliver the output magnetic field value to a user interface, the piloting module being further configured to pilot the probe signal generation unit to generate the electrical current in the probe.

Devices for measuring magnetic fields are used on a wide spectrum of activities, for example for detecting ferromagnetic objects or mapping a magnetic field. Applications include for example oil and gas exploration or military surveillance.

Known devices for measuring a magnetic field include fluxgates. Fluxgates are compact devices that allow a precise measurement of a magnetic field. However, fluxgates often offer a limited measurement bandwidth and require encapsulation as well as thermal drift compensation.

Alternative devices are consequently investigated to offer precise measurement of the magnetic field on large bandwidth, such as giant magneto-impedance magnetometers.

Giant magneto-impedance magnetometers, also known as GMI magnetometers, comprise probes, generally formed from an amorphous wire, which are characterized by a large variation of their impedance when they are driven by a high-frequency current and subjected to an external magnetic field parallel to the main axis direction of the probe.

In a configuration called off-diagonal GMI, a pick-up coil surrounds the probe of the GMI magnetometer. This pick-up coil is configured to sense a signal depending on the magnetic field generated by the high-frequency current in the probe, which itself depends on the external magnetic field. In other words, the pick-up coil is configured to sense the response of the probe of the GMI magnetometer.

Although such GMI-magnetometer generally offer a higher measurement bandwidth as Fluxgates, current giant magneto-impedance sensors are not entirely satisfying. In fact, these devices are dependent on the probe being used and offer a variable sensitivity.

An objective of the invention is to provide a device for measuring a magnetic field that is easy to implement.

To that end, the invention deals with a device for measuring a magnetic field wherein the control circuit further comprises a correction module connected to the preamplification module and to the buffer module, and being configured to control a working magnetic field generated by the feedback coil around the probe, the working magnetic field corresponding to a magnetic field maximizing the magnetic field sensitivity of the probe and minimizing the magnetic field noise of the probe.

The controlling of a working magnetic field generated by the feedback coil is especially advantageous as the working magnetic field ensures that the probe is at its best sensitivity working point and reduces the dependence of the measurement on the probe being used. This makes the device for measuring a magnetic field especially easy to implement.

According to specific embodiments of the invention, the device for measuring a magnetic field further presents one or several of the features mentioned below, considered independently or along any technically possible combination:
- the piloting module is further configured to pilot the feedback coil to generate a plurality of scanning magnetic fields, the piloting module being configured to identify the working magnetic field among the scanning magnetic fields, using the output magnetic field values deduced from the pick-up coil voltage;
- the plurality of scanning magnetic fields is ranging in field within a dynamic range of the device and in frequency within a bandwidth of the device;
- the probe signal generation unit is configured to generate a dual modulated electrical current probe intensity in the probe, the dual modulated electrical current probe intensity comprising a first periodic component and a second periodic component;
- the dual modulated current of probe intensity is a current comprising a first periodic component and a second periodic component, the frequency of the second periodic component being between 10 and 100 times lower than the frequency of the first periodic component, the frequency of the first periodic component being comprised between 0.5 MHz and 100 MHz;
- the generation module comprises a reference signal generation unit configured to generate a reference signal for the preamplification module, the piloting module being configured to synchronize the reference signal to the second periodic component generated by the probe signal generation unit;
- the preamplification module comprises a threshold-free peak detector;
- the magnetic field sensor comprises a single coil, the single coil being configured to function both as the pick-up coil and as the feedback coil.

The invention also deals with a system for measuring a magnetic field, wherein the system comprises at least two devices for measuring a magnetic field as previously described.

The invention also deals to a method for measuring a magnetic field, comprising the following steps:
- providing of a device for measuring a magnetic field as previously described;
- piloting, by the piloting module, of the feedback coil to generate a plurality of scanning magnetic fields and identifying the working magnetic field among the scanning magnetic fields, using the output magnetic field values deduced from the pick-up coil voltage;
- controlling, by the correction module, of the working magnetic field generated by the feedback coil around the probe, the working magnetic field corresponding to a magnetic field maximizing the magnetic field sensitivity of the GMI and minimizing the magnetic field noise of the probe;

measuring of the magnetic field value by the device for measuring a magnetic field, the buffer module delivering an output signal of the control circuit, the output signal defining the magnetic field value, the magnetic field value being deduced from the pick-up coil voltage.

Other features and advantages of the invention will become apparent from a detailed description which is given thereof below, as an indication and by no means as a limitation, with reference to the appended figures, wherein.

Figure 1:
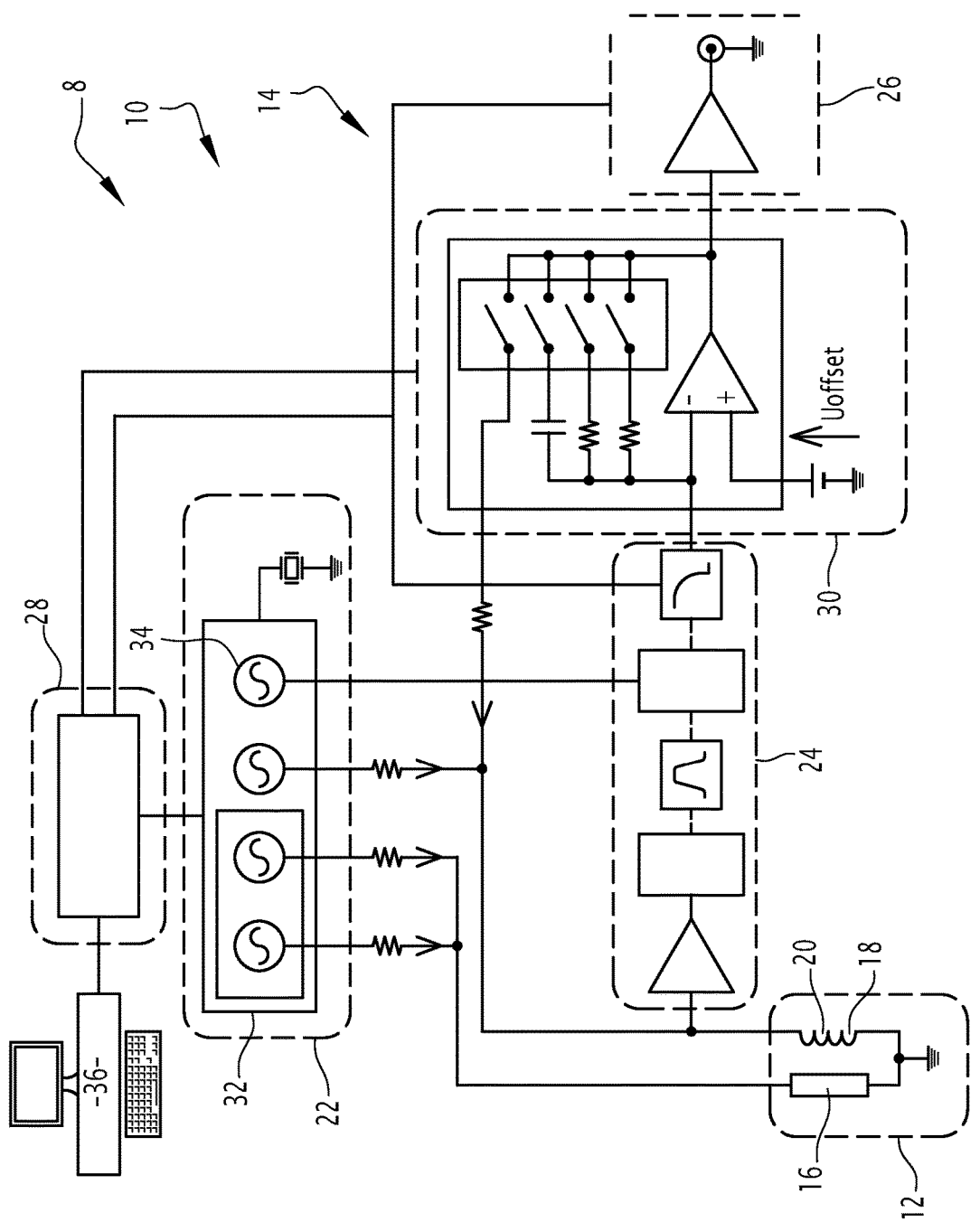
FIG. 1 is a schematic representation of a system for measuring a magnetic field comprising one device for measuring a magnetic field according to the invention.

A system 8 for measuring a magnetic field is presented in FIG. 1. In the example of FIG. 1, the system 8 comprises a unique device 10 for measuring a magnetic field.

In other non-presented embodiments, the system 8 comprises a plurality of devices 10 for measuring a magnetic field. The system 8 comprises for example at least two devices 10 for measuring a magnetic field.

In reference to FIG. 1, the device 10 for measuring a magnetic field comprises a magnetic field sensor 12 and a control circuit 14.

Figure 2:
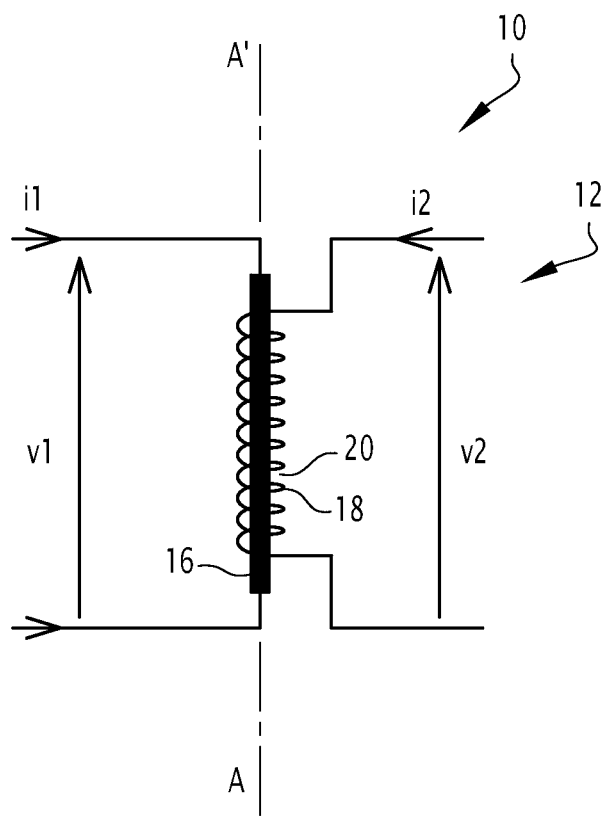
FIG. 2 is a schematic representation of a magnetic field sensor of the device for measuring a magnetic field represented in FIG. 1.

In reference to FIG. 2, the magnetic field sensor 12 comprises a probe 16, a pick-up coil 18 and a feedback coil 20.

The probe 16 is in particular formed from a material that exhibits a giant magneto impedance. Such probe 16 has an impedance strongly dependent of an external magnetic field.

The probe 16 is formed from an amorphous wire or a ferromagnetic ribbon. The probe 16 is for example formed from a CoFeSiB-based soft amorphous wire.

The probe 16 comprises two ends and extends longitudinally along a probe axis A-A' between the two ends of the probe 16, as it is illustrated on FIG. 2.

The probe 16 is configured to conduct an electrical current of probe intensity i1 defining a voltage v1 between the two ends of the probe.

The two ends of the probe 16 are electrically connected to the control circuit 14.

In the example represented in FIG. 2, the magnetic field sensor 12 comprises a single coil which is configured to be operated both as the pick-up coil 18 and as the feedback coil 20.

In other examples (non-represented), the pick-up coil 18 and the feedback coil 20 are distinct physically. The pick-up coil 18 is for example coiled around the feedback coil 20 or the feedback coil 20 is for example coiled around the pick-up coil 18.

The pick-up coil 18 and the feedback coil 20 are coiled around the probe 16. In particular, the pick-up coil 18 and the feedback coil 20 comprise a conductor wire coiled around the probe 18, around the probe axis A-A'. The conductor wires of the pick-up coil 18 and of the feedback coil 20 is for example coiled between 200 and 1000 times around the probe 18.

The pick-up coil 18 comprises two ends, the two ends of the pick-up coil 18 being connected to the control circuit 14.

The feedback coil 20 comprises two ends, the two ends of the feedback coil 20 being connected to the control circuit 14.

In the example of FIG. 2, the single coil operated both as the pick-up coil 18 and as the feedback coil 20 comprises two ends.

The pick-up coil 18 is configured to conduct an electrical current of intensity i2 defining a voltage v2 between the two ends of the pick-up coil 18.

The control circuit 14 comprises a generation module 22, a preamplification module 24, a buffer module 26, a piloting module 28 and a correction module 30.

The generation module 22 comprises a probe signal generation unit 32 and a reference signal generation unit 34.

The probe signal generation unit 32 is configured to generate the electrical current of intensity i1 conducted by the probe 16. The probe signal generation unit 32 is for example configured to generate an alternative current of intensity i1.

The probe signal generation unit 32 is for example configured to generate a dual modulated current of probe intensity i1 in the probe 16.

The dual modulated current of intensity i1 is a current comprising a first periodic component and a second periodic component. The frequency of the second periodic component is preferably between 10 and 100 times lower than the frequency of the first periodic component. The frequency of the first periodic component is preferably comprised between 0.5 MHz and 100 MHz.

The first periodic component is for example a sinusoidal component. Alternatively, the first periodic component is a sum of sinusoidal components.

The peak to peak amplitude of the first periodic signal is comprised for example between 1 mA and 100 mA, preferably between 20 mA and 40 mA.

The second periodic component is for example a sinusoidal component. Alternatively, the second periodic component is a sum of sinusoidal comments. The second periodic component is for example a square wave.

The peak to peak amplitude of the second periodic signal is comprised for example between 1 mA and 100 mA, preferably between 20 mA and 40 mA.

The probe signal generation unit 32 preferably comprises two independent current sources, the amplitude and the frequency of the two currents generated by the two independent current sources corresponding to the amplitude and the frequency of the first and second periodic signal.

The amplitude of the two currents generated by the two independent current sources is preferably independently controlled by the probe signal generation unit 32. The amplitude ratio between the two currents generated by the two independent current sources is for example chosen depending on the material of the probe 16.

The frequency of the two currents generated by the two independent current sources is preferably independently controlled by the probe signal generation unit 32. The reference signal generation unit 34 is configured to generate a reference signal for the preamplification module 24. The reference signal is synchronized with the second periodic component generated by the probe signal generation unit 32.

The preamplification module 24 is connected to the two ends of the pick-up coil 18. The preamplification module 24 is in particular configured to measure the pick-up coil voltage v2, to amplify the measured pick-up coil voltage v2 and to demodulate the pick-up coil voltage v2 using the reference signal.

The buffer module 26 is configured to deliver an output signal of the control circuit. The buffer module is configured to isolate the output signal of the control circuit 14 from interferences of the piloting module 28 and the correction module 30.

The output signal defines an output magnetic field value deduced from the pick-up voltage v2. The output signal is transmitted from the buffer module 26 to the piloting module 28.

The correction module 30 is connected to the preamplification module 24 and to the buffer module 26. The correction module 30 is configured to control a working magnetic field generated by the feedback coil 20 around the probe 16. The correction module 30 is for example configured to control an offset tension Uoffset to control the working magnetic field generated by the feedback coil.

The correction module 30 preferably comprises a proportional-integral-derivative controller, also known as PID controller.

The working magnetic field corresponds to a magnetic field maximizing the magnetic field sensitivity of the probe 16 and minimizing the magnetic field noise of the probe 16.

In particular, the impedance variation of the probe 16 for a variation of an external magnetic field is at its maximum when the probe 16 is exposed to the external magnetic field combined with the working magnetic field.

The variation of the pick-up coil voltage v2 for a variation of an external magnetic field is at its maximum when the probe 16 is exposed to the external magnetic field combined with the working magnetic field.

The piloting module 28 is connected to the generation module 22 and to the buffer module 26.

The piloting module 28 is configured to receive the output signal from the buffer module 26 and to deliver the output magnetic field value to a user interface 36.

The piloting module 28 is configured to pilot the probe signal generation unit 32 to generate the electrical current in the probe 16.

The piloting module 28 is for example configured to pilot the reference signal generation unit 34. The piloting module is preferably configured to synchronize the reference signal to the second periodic component generated by the probe signal generation unit.

The piloting module 28 is configured to pilot the feedback coil 20 to generate a plurality of scanning magnetic fields. The plurality of scanning magnetic fields should be understood as a set scanning magnetic fields. In other words, the plurality of scanning magnetic fields includes several different magnetic fields.

In particular, the piloting module 28 is configured to pilot the correction module 30 to generate a scanning feedback voltage between the two ends of the feedback coil 20.

The piloting module 28 is configured to identify the working magnetic field among the scanning magnetic fields using the output magnetic field values deduced from the total pick-up coil voltage v2.

The plurality of scanning magnetic fields is ranging in field within a dynamic range of the device 10 for measuring a magnetic field and is ranging in frequency within a bandwidth of the device 10 for measuring a magnetic field.

The bandwidth of the device 10 for measuring a magnetic field is for example comprised between 1 kHz and 100 kHz.

The dynamic range of the device 10 is for example higher than 120-140 dB/NHz.

The preamplification module 24 preferably comprises a threshold free peak detector. The preamplification module 24 comprises for example a diode threshold free peak detector.

Figure 3:
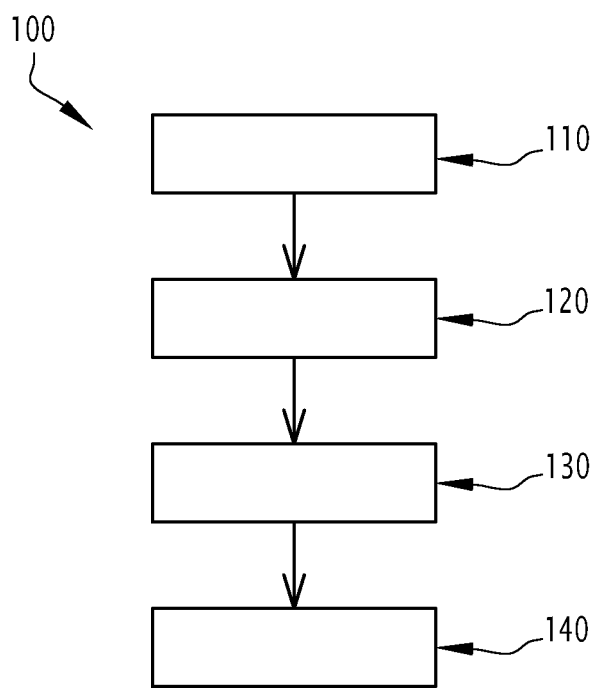
FIG. 3 is a flow chart representing the steps of a method for measuring a magnetic field according to the invention.

A method 100 for measuring a magnetic field according to the invention will now be described in reference to FIG. 3 presenting a flow chart of its steps.

In a first step 110, a device 10 as previously described is provided. The device is placed in an external magnetic field which is to be measured.

The first step 110 is followed by a piloting step 120.

In the piloting step 120, the piloting module 28 pilots the feedback coil 20 to generate a plurality of scanning magnetic fields. The piloting module 28 identifies the working magnetic field among the scanning magnetic fields, using the output values deduced from the total pick-up coil voltage v2.

Once the working current is identified, the piloting step 120 is followed by a controlling step 130. In the controlling step 130, the correction module 30 controls the working magnetic field generated by the feedback coil 20 around the probe 16. The magnetic field controlled by the correction module 30 corresponds to a magnetic field maximizing the magnetic field sensitivity of the probe and minimizing the magnetic noise of the probe 16.

A measuring step 140 is performed during the control step 130. During the measuring step 140, the device 10 for measuring a magnetic field measures a magnetic field value. In particular, the magnetic field value is deduced from the pick-up coil voltage v2. The pick-up coil voltage v2 is amplified by the preamplification module 24 before being transmitted to the buffer module 26 through the correction module 30. The buffer modules 26 delivers then an output signal defining the magnetic field value. This output signal is for example transmitted to the piloting module 28 that is configured to connect with a user interface 36, for example for displaying the magnetic field value.

Such a device 10 for measuring a magnetic field is especially advantageous as it allows to automatically generate a working magnetic field optimizing the performance of the magnetic field sensor 12. In particular, it contributes in making the device 10 for measuring a magnetic field especially easy to use. It makes the device for measuring a magnetic field fall into the category of a smart sensor. The working magnetic field optimizing the performance of the device 10 also allows to reach a sensitivity of 100 kV/T to 200 kV/T, as an example.

The use of scanning currents allows to find the best working point possible for the device.

The use of a dual modulated current sources in the probe 16 is especially useful to counteract the impact of temperature variations on the device 10. In particular, it allows providing the device 10 for measuring a magnetic field a temperature sensitivity lower than 2 nT/K.

The reference signal generation unit 34 is especially advantageous to demodulate the signal in the preamplification module 24 and reduces noise in measurement of the device 10.

The use of a threshold-free peak detector also contributes to decrease noise in the device 10 for measuring a magnetic field.

A single coil being configured to function both as a pick-up coil 18 and a feedback coil 20 is especially advantageous as it allows to obtain a compact magnetic field sensor 12.

A system 8 for measuring a magnetic field comprising at least two devices 10 for measuring a magnetic field is beneficial as it allows a multidimensional magnetic field measurement.

The theoretical and measured performances of a device 10 for measuring a magnetic field as previously described are presented in the table 1 below, under the column "GMI double excitation". The performances of other devices, in particular a device 10 for measuring a magnetic field wherein the probe signal generation unit is configured to generate a single modulated electrical current probe intensity i1 in the probe 16, and a fluxgate, are presented in the columns "GMI classical setup" and "Reference Fluxgate respectively".

TABLE 1

| Magnetometers | GMI classical setup | | GMI double excitation | | Reference Fluxgate | Comments |
|---|---|---|---|---|---|---|
| | Theory | Measure | Theory | Measure | Measure | |
| Long term stability for the first 12 h [nT/h] | — | 4 | — | 0.3 | 0.5 | evaluated for the first 12 hours of an acquisition |
| Long term stability for 12 h, measured after 20 h [nT/h] | — | 0.85 | — | 0.13 | 0.13 | evaluated after 20 hours of an acquisition |
| ODDT (Offset Drift Depending on Temperature) [nT/K] | [−0.55, −10.4] | −9.5 | [0, −4.8] | −1.8 | 4.3 | evaluated for a residual static field of 0 µT and 26 µT, for an anisotropy field having an angle of 85° from the axial direction of the probe 16 |
| Equivalent magnetic noise at 1 Hz [pT/√Hz] | 14 | 13 | 4.1 | 255 | 10 | expressed by the ratio of the voltage fluctuations (in V/√Hz) at 1 Hz for the GMI classical setup, or at 10 kHz for the double excitation one, to the voltage sensitivity (in V/T) of each setup |
| White noise [pT/√Hz] | 2.9 | 3.5 | 4.1 | 80 | 6 | — |
| Voltage sensitivity [kV/T] | 212.7 | 198 | 212.7 | 256 | 143 | — |
| Bandwidth [kHz] | 24 | 2 | 0.32 | 0.26 | 3 | limited by low-pass filters of 2 kHz for the GMI classical setup and and 260 Hz for the GMI double excitation setup |

The invention claimed is:

1. A device for measuring a magnetic field comprising:
   a magnetic field sensor, comprising:
      a probe formed from an amorphous wire or a ferromagnetic ribbon, and
      a pick-up coil and a feedback coil, or a single coil which is configured to be operated both as the pick-up coil and the feedback coil, the pick-up coil and the feedback coil being coiled around the probe, and
   a control circuit, comprising:
      a generation module comprising a probe signal generation unit, configured to generate an electrical current of probe intensity defining a probe voltage between two ends of the probe,
      a preamplification module, configured to measure and to preamplify a pick-up coil voltage between two ends of the pick-up coil,
      a buffer module, configured to deliver an output signal of the control circuit, the output signal defining an output magnetic field value deduced from the pick-up coil voltage, and
      a piloting module connected to the generation module and to the buffer module and configured to receive the output signal from the buffer module and to deliver the output magnetic field value to a user interface, the piloting module being further configured to pilot the probe signal generation unit to generate the electrical current in the probe;
   wherein the control circuit further comprises a correction module connected to the preamplification module and to the buffer module, and being configured to control a working magnetic field generated by the feedback coil around the probe, the working magnetic field corresponding to a magnetic field maximizing the magnetic field sensitivity of the probe and minimizing the magnetic field noise of the probe.

2. The device for measuring a magnetic field according to claim 1, wherein the piloting module is further configured to pilot the feedback coil to generate a plurality of scanning magnetic fields, the piloting module being configured to identify the working magnetic field among the scanning magnetic fields, using the output magnetic field values deduced from the pick-up coil voltage.

3. The device for measuring a magnetic field according to claim 2, wherein the plurality of scanning magnetic fields is ranging in field within a dynamic range of the device and in frequency within a bandwidth of the device.

4. The device for measuring a magnetic field according to claim 1, wherein the probe signal generation unit is configured to generate a dual modulated electrical current probe intensity in the probe, the dual modulated electrical current probe intensity comprising a first periodic component and a second periodic component.

5. The device for measuring a magnetic field according to claim 4, wherein the dual modulated current of probe intensity is a current comprising a first periodic component and a second periodic component, the frequency of the second periodic component being between 10 and 100 times lower than the frequency of the first periodic component, the frequency of the first periodic component being comprised between 0.5 MHz and 100 MHz.

6. The device for measuring a magnetic field according to claim 5, wherein the generation module comprises a reference signal generation unit configured to generate a reference signal for the preamplification module, the piloting module being configured to synchronize the reference signal to the second periodic component generated by the probe signal generation unit.

7. The device for measuring a magnetic field according claim 1, wherein the preamplification module comprises a threshold-free peak detector.

8. The device for measuring a magnetic field according to claim 1, wherein the magnetic field sensor comprises a single coil, the single coil being configured to function both as the pick-up coil and as the feedback coil.

9. A system for measuring a magnetic field, wherein the system comprises at least two devices for measuring a magnetic field according to claim 1.

10. A method for measuring a magnetic field, comprising the following steps:
 providing of a device for measuring a magnetic field according to claim 1;
 piloting, by the piloting module, of the feedback coil to generate a plurality of scanning magnetic fields and identifying the working magnetic field among the scanning magnetic fields, using the output magnetic field values deduced from the pick-up coil voltage;
 controlling, by the correction module, of the working magnetic field generated by the feedback coil around the probe, the working magnetic field corresponding to a magnetic field maximizing the magnetic field sensitivity of the GMI and minimizing the magnetic field noise of the probe
 measuring of the magnetic field value by the device for measuring a magnetic field, the buffer module delivering an output signal of the control circuit, the output signal defining the magnetic field value, the magnetic field value being deduced from the pick-up coil voltage.

* * * * *